United States Patent
Lin

(10) Patent No.: US 7,814,397 B2
(45) Date of Patent: Oct. 12, 2010

(54) INTELLIGENT ERROR CHECKING METHOD AND MECHANISM

(75) Inventor: Tzueng-Yau Lin, Tai-Chung Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 256 days.

(21) Appl. No.: 12/142,798

(22) Filed: Jun. 20, 2008

(65) Prior Publication Data

US 2008/0250307 A1    Oct. 9, 2008

Related U.S. Application Data

(63) Continuation of application No. 11/162,361, filed on Sep. 8, 2005, now Pat. No. 7,421,641, which is a continuation-in-part of application No. 10/064,212, filed on Jun. 21, 2002, now Pat. No. 6,959,411.

(51) Int. Cl.
    H03M 13/00 (2006.01)
(52) U.S. Cl. .................. 714/779; 714/776
(58) Field of Classification Search .......... 714/779, 714/776
    See application file for complete search history.

(56) References Cited

U.S. PATENT DOCUMENTS

| | | | | |
|---|---|---|---|---|
| 5,241,546 A | * | 8/1993 | Peterson et al. | 714/761 |
| 5,448,592 A | * | 9/1995 | Williams et al. | 375/261 |
| 6,591,390 B1 | * | 7/2003 | Yagyu | 714/755 |
| 6,772,385 B2 | * | 8/2004 | Ohyama et al. | 714/755 |
| 6,959,411 B2 | * | 10/2005 | Lin | 714/763 |
| 7,137,060 B2 | * | 11/2006 | Yu et al. | 714/794 |
| 2001/0053225 A1 | * | 12/2001 | Ohira et al. | 380/239 |
| 2003/0229843 A1 | * | 12/2003 | Yu et al. | 714/794 |

\* cited by examiner

*Primary Examiner*—M. Mujtaba K Chaudry
(74) *Attorney, Agent, or Firm*—Winston Hsu; Scott Margo; Min-Lee Teng

(57) ABSTRACT

An intelligent streaming media error check detection method and apparatus. The claimed invention discloses an apparatus and method where all streaming media are initially assumed to have compatible error checksums. A parameter W is initialized to zero. The parameter W is not constant and conceptually represents a state of the error check method. The destructive value of a first predefined constant is added to the parameter W each time the acceptability of a data set cannot be verified. The constructive value of a second predefined constant is subtracted from the parameter W each time the acceptability of a data set is successfully verified. If the value of the parameter W equals or exceeds a predefined threshold, the remainder of the streaming media is decoded and played without error check protection.

7 Claims, 2 Drawing Sheets

INTELLIGENT ERROR CHECKING METHOD AND MECHANISM

CROSS REFERENCE TO RELATED APPLICATIONS

This continuation application claims the benefit of U.S. patent application Ser. No. 10/064,212 (filed on Jun. 21, 2002) and U.S. patent application Ser. No. 11/162,361 (filed on Sep. 8, 2005), which are included herein by reference.

BACKGROUND

The present invention relates to a method for error checking when playing streaming data. More specifically, a method of playing streaming media while providing error check protection when a recognizable error check field exists in a data set, and playing the data set without error checking when a recognizable error check field does not exist in the data set is disclosed.

Streaming media is data that can be progressively played to a user as it is transmitted, without the need for first being downloaded in entirety. Taking an MPEG-1 audio layer III (MP3) streaming media for example, it is an ISO/IEC (International Organization for Standardization and International Electrotechnical Commission) standard of audio coding with high quality and high efficiency. Streaming media is often used to transmit audio-visual (AV) data, such as live news broadcasts. Some of the most common streaming servers are Microsoft Media Player, Quick Time and RealNetworks RealPlayer.

Referring to FIG. 1, related art streaming media consists of a collection of packets or data blocks, where every block consists of a sequence of frames, herein described as data sets. Each data set comprises several fields such as a header 1, including a synchronization information (SI) header and a bit stream information (BSI) header, an error check field 2, a multimedia_data field 3, and an external_data 4. The bit stream information (BSI) header follows the Si header, and contains parameters describing the coded audio/visual service. The multimedia data field contains the encoded multimedia data, i.e. audio samples or video samples. The SI and BSI fields describe the bitstream configuration, including sample rate, data rate, number of coded channels, and several other systems-level elements. A protection bit discloses whether error protection is used in the set of data. The error check information in the error check field could be generated from using a message digest 5 (MD5) algorithm or other known error checking algorithms.

While using the error check is not necessary to encode and decode a data set of the streaming media, as with any error trapping routine, error checking can improve performance by correcting or eliminating faulty data sets (frames) before playing. The error check can be used to determine if the data set has been written and read correctly and is quite useful for providing accurate reproduction of sound/video, but is most valuable only if used in a consistent manner.

Different encoders can generate different error check fields although the input source is the same. Some encoders may possibly use a wrong generator polynomial, a wrong initial state, or simply calculate incorrectly, all resulting in a wrong error check value. Because of this, the error check field encoded by one encoder is not always acceptable to a different decoder. Additionally, some encoders simply skip using error checking and mark the protection bit of the header with a 1 meaning that no error check field exists within the data set to be processed.

Different stream media decoders deal with this problem with different approaches. One of the most common strategies used is simply not to play data sets with wrong error check fields. This policy does eliminate the noise resulting from individual corrupted data sets. However, this same policy makes it impossible to play a data set generated by an incompatible encoder or a data set simply lacking fields even though all of the other data in the data set is complete and correct. Therefore, this approach limits the streaming media that can be played by the decoder to only those streaming media perfectly compatible with the right message digest protection.

Another well-known approach to the incompatibility problem is to go to the other extreme and never use error check protection regardless whether the protection is or is not available. While this strategy allows the playing of all data sets of the streaming media regardless of the encoders, the strategy fails to eliminate noise resulting from corrupted data sets within a compatible bitstream.

SUMMARY OF THE INVENTION

It is therefore one of the objectives of the present invention to provide a method and apparatus able to play streaming media generated by different encoders, and to additionally provide error check protection when a particular data set comprises a recognizable error check field. A recognizable error check field is defined to be one with which the apparatus, using the error check field of the data set, can successfully verify the acceptability of the multimedia data within the data set.

Briefly summarized, the present invention discloses a method where all streaming media are initially assumed to have compatible error check fields. A parameter W represents a state of the error check method. The destructive value of a first predefined constant is added to the parameter W each time the acceptability of multimedia data within the data set cannot be verified. The constructive value of a second predefined constant is subtracted from the parameter W each time the acceptability of multimedia data within the data set is successfully verified. If the value of the parameter W equals or exceeds a predefined threshold, the remainder of the streaming media is decoded and played without any further detection of the error check protection.

A looped process proceeds sequentially through the streaming media. The error check field of each successive data set is checked for validity. If the checksum is valid, meaning that the acceptability of multimedia data within the data set is confirmed by a control circuit, or message digest algorithm within the error check field, the value held by the parameter W is reduced by a constructive, second predefined constant and the multimedia data is decoded and outputted for play. If the value of the parameter W is less than zero, the value of W is reset to zero. If the checksum is invalid, meaning that the acceptability of multimedia data cannot be confirmed by the control circuit or message digest algorithm within the error check field, the value held by the parameter W is increased by a destructive, first predefined constant and the multimedia data is not played, but is kept un-decoded and then stored in a buffer for possible later referencing. The next data set is located and the looped process continues until either the end of the streaming media is reached or the value of the parameter W equal or exceeds the predefined threshold.

As stated above, if the value of the parameter W equals or exceeds the predefined threshold, attempts to use the error check field of the data set to verify the multimedia data within the data set are abandoned and the remainder of the streaming media is decoded and played without the benefit of error check protection.

It is an advantage of the claimed invention that the method is able to play streaming media generated by any encoder, and to additionally provide error check protection when the streaming media comprises recognizable error check fields.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
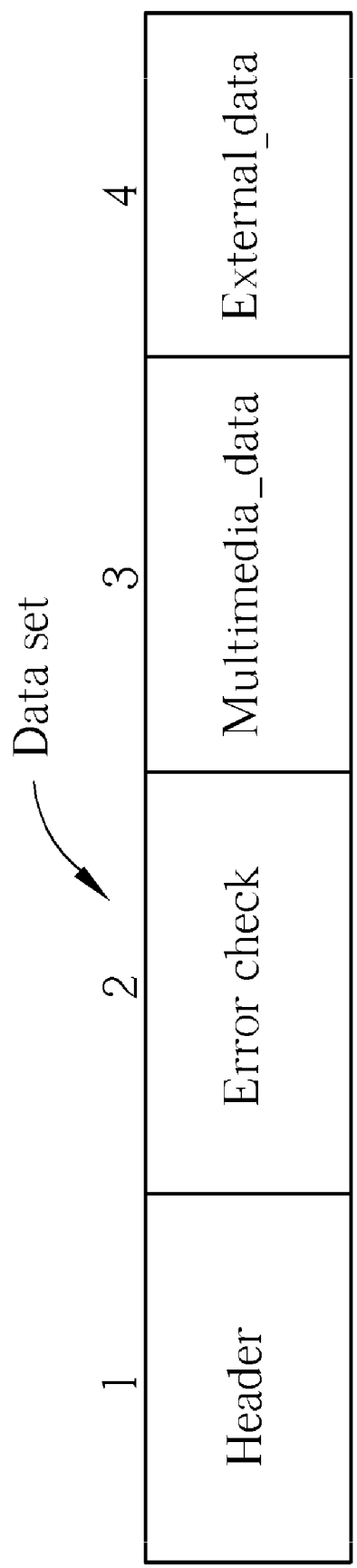
FIG. 1 illustrates a related art data set.
Figure 2:
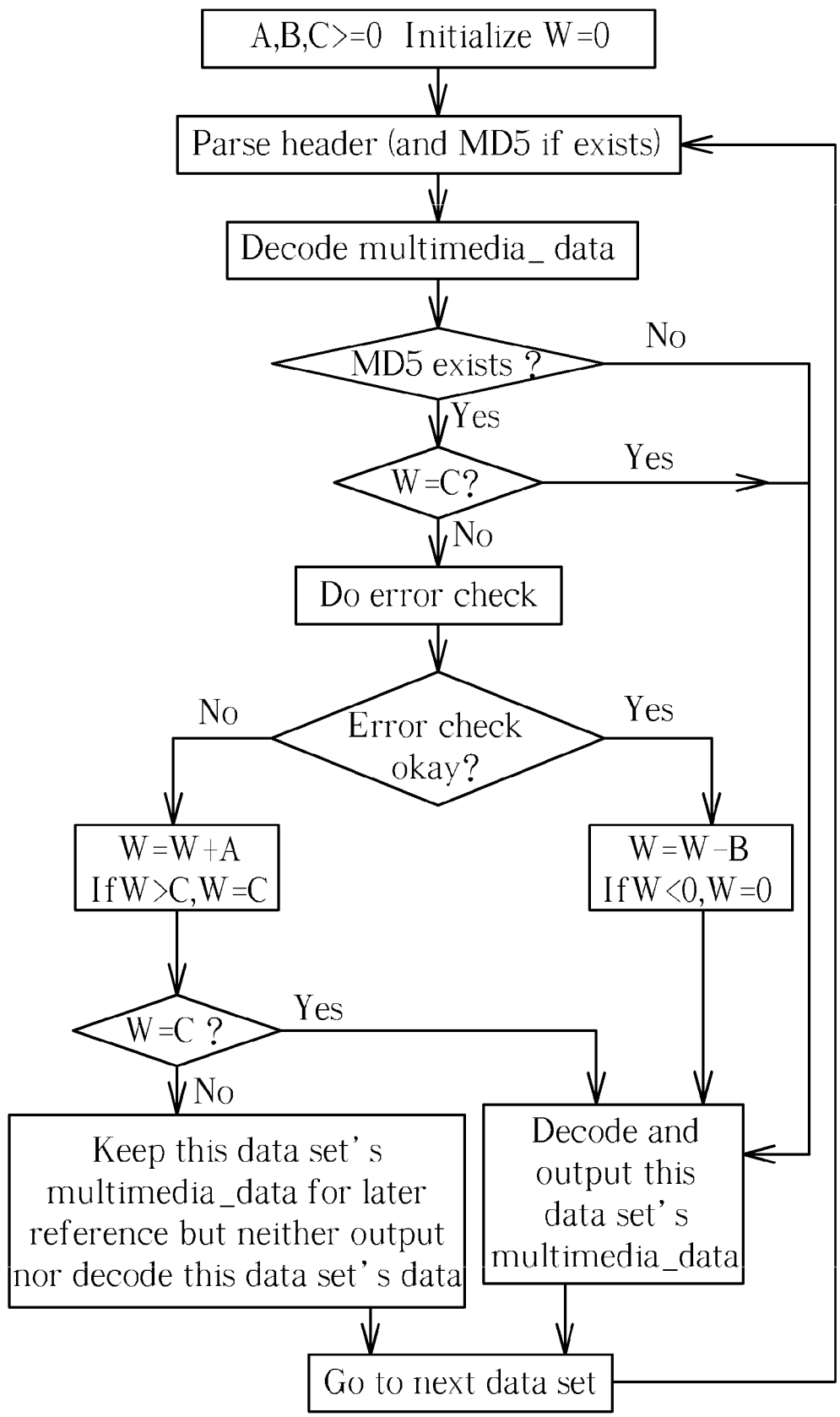
FIG. 2 is a flowchart illustrating an embodiment of error check detection according to the present invention.

Please refer to FIG. 2 illustrating a flowchart of one embodiment according to the present invention. Four initial parameters A, B, C, and W are used to control whether or not error check protection is to be used when decoding the data sets of streaming media. In application, these parameters may be variables, registers, or in other forms.

The parameters A, B, and C are normally set to predefined constant values in the computer server and remain constant throughout the decoding and playing process. The first predefined constant A represents a destructive weighing factor used each time the acceptability of the multimedia data within a data set cannot be verified. The second predefined constant B represents a constructive weighing factor used each time the acceptability of the multimedia data within a data set is verified. The third predefined threshold C represents a maximum tolerance for permitted error check errors allowed before abandoning efforts to provide error checking while decoding and outputting the streaming media. In this embodiment of the present invention, the parameters A, B, and C are all set to values greater than or equal to zero, but using one or more negative values and adjusting any calculations accordingly also falls within the scope of the invention.

The parameter W is not constant and represents a state of the error check method. The destructive value of the first predefined constant A is added to the parameter W each time the acceptability of the multimedia data within a data set cannot be verified. The constructive value of the second predefined constant B is subtracted from the parameter W each time the acceptability of the multimedia data within a data set is successfully verified. If the value of the parameter W equals or exceeds the predefined threshold C, the remainder of the streaming media is decoded and played without the benefit of error check protection. The parameter W is initialized to zero before beginning to decode the streaming media.

The first step in the present method after parameter initialization is to parse the header 1 of a data set and determine if an error check field 2 exists. The multimedia data stored in the multimedia data field 3 is decoded next followed by the first decision point in the method. If the parameter W is greater than or equal to the predefined threshold C, the multimedia data of the data set is decoded and outputted without error check protection. This allows streaming media lacking error check fields or streaming media with unrecognizable error check fields to be properly decoded and played.

If the parameter W is not equal to C (it also means the parameter W is less than the predefined threshold C at this point), an error check is performed and another decision point in the flowchart has been reached. If the results of the error check confirm the acceptability of the multimedia data within the data set, the constructive factor contained in the second predefined constant B is subtracted from the parameter W. If the subtraction results in the parameter W being less than zero, the parameter W is set to zero. This feature recognizes that otherwise perfectly good streaming media may contain one or more corrupted data sets. Because a valid checksum has been found, by reducing the parameter W the constructive feature ensures using error checking whenever possible. It should be obvious that the ability and tenaciousness of this feature is greatly controlled by the relative magnitudes of the second predefined constant B and the predefined threshold C. After updating the value of the parameter W, the data set is further decoded and output for play.

However, if the results of the error check are not correct, the destructive factor contained in the first predefined constant A is added to the parameter W. If the addition results in the parameter W being greater than the predefined threshold C, the parameter W is set to the same value as the predefined threshold C. This feature also recognizes that otherwise perfectly good streaming media may contain one or more corrupted data sets. Just because an invalid checksum has been found does not necessarily mean that error check protection cannot be used on other data sets in the streaming media. As before, by increasing the parameter W the destructive feature ensures using error checking whenever possible by not abandoning error checking until the predefined threshold C has been reached. It should also be clear that the ability and tenaciousness of this feature is greatly controlled by the relative magnitudes of the first predefined constant A and the predefined threshold C.

After updating the value of the parameter W in the destructive branch of the flowchart (meaning a wrong error check result), another check is made to decide if the parameter W equals the predefined threshold C. When W is greater or equal to C, the maximum threshold for tolerance for errors has been reached and no further error checking will be done on the streaming media. Accordingly, the multimedia data within the data set is decoded and outputted without error check protection. If the stated equality does not hold and the parameter W is less than the predefined threshold C, the maximum threshold for tolerance for errors has not been reached. However, it cannot be determined if a single corrupt data set has been found or if the entire data block consists of a sequence of data sets with wrong error check fields. In this case, the multimedia data of the data set is stored in a buffer for possible later referencing but is neither decoded nor outputted. This feature of the present method prevents the unwanted disturbance often generated by corrupted or missing multimedia data while continuing to provide error check protection to the data block.

In contrast to the prior art, the present invention can play streaming media generated by different encoders, and additionally provide error check protection when the streaming media comprises recognizable error check fields. Additionally, the predefined values of the constants A, B, and the threshold C can be adjusted to determine the sensitivity of the method. For example, when C>0, A=0, and B>0, the method will always perform an error check. When the parameter C=0, the method will never perform an error check. The ability to adjust the values of the constants A, B, and the threshold C provides greater flexibility in the decoding of streaming media without having to redesign the decoder itself. Depending on the selection of the values for the constants A, B, and the threshold C, the present invention can play streaming media processed by different encoders and still provide error check protection whenever possible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of reproducing streaming media with a control apparatus, the streaming media comprising a plurality of data sets, each data set having an optional error check field, and a multimedia data field for storing multimedia data, the control apparatus including a parameter, the method comprising:

if the error check field of the data set exists, using the error check field to verify acceptability of the data set; if the acceptability of the data set is verified, decoding the multimedia data in the multimedia data field; if the acceptability of the data set is unable to be verified and the parameter indicates that the error check field no longer needs to be used to verify the acceptability of the data set, decoding the multimedia data in the multimedia data field; if the acceptability of the data set is unable to be verified and the parameter indicates that the error check field is to be used to verify the acceptability of the data set, skipping decoding the multimedia data in the multimedia data field.

2. The method of claim 1 wherein a first predefined constant is used as a destructive factor in calculations determining whether or not to continue using the error check field to verify the acceptability of the multimedia data within the data set.

3. The method of claim 2 wherein a second predefined constant is used as a constructive factor in calculations determining whether or not to continue using the error check field to verify the acceptability of the multimedia data within the data set.

4. The method of claim 3 wherein the parameter is a totalizer for accumulating the constructive and destructive factors utilized during processing of the streaming media so that when the value held in the totalizer is less than a predetermined threshold, the method continues using the error check field to verify the acceptability of the multimedia data within the data set and when the value held in the totalizer is greater than or equal to the predetermined threshold, the error check field is not to be used to verify the acceptability of the multimedia data within the data set.

5. The method of claim 4 wherein the totalizer is a variable, a register, or a counter.

6. The method of claim 1 wherein the area of the data set capable of being verified as acceptable by the control apparatus excludes the error check field.

7. The method of claim 1 wherein the control apparatus is implemented by a circuit or a message digest algorithm.

* * * * *